(12) United States Patent
Suzuki

(10) Patent No.: US 6,430,023 B1
(45) Date of Patent: Aug. 6, 2002

(54) INPUT DEVICE

(75) Inventor: Katsutoshi Suzuki, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/881,992

(22) Filed: Jun. 15, 2001

(30) Foreign Application Priority Data

Jun. 16, 2000 (JP) ........................................ 2000-185919
Jun. 16, 2000 (JP) ........................................ 2000-185920

(51) Int. Cl.[7] .............................. H01G 5/16; H01G 5/00; H01G 5/14
(52) U.S. Cl. ..................... 361/290; 361/288; 361/292; 361/287; 361/296
(58) Field of Search ................................ 361/277, 278, 361/283.1, 287, 288, 290, 291, 292, 296, 297, 299.4, 299.5, 298.2

(56) References Cited

U.S. PATENT DOCUMENTS

| | | | |
|---|---|---|---|
| 4,472,758 A | * | 9/1984 | Goto et al. ................. 200/600 |
| 5,421,213 A | | 6/1995 | Okada |
| 5,424,906 A | * | 6/1995 | Kishishita et al. ......... 29/25.42 |
| 5,461,535 A | * | 10/1995 | Kishishita et al. .......... 361/293 |
| 5,559,665 A | * | 9/1996 | Taranowski et al. ........ 361/280 |

* cited by examiner

*Primary Examiner*—Anthony Dinkins
(74) *Attorney, Agent, or Firm*—Brinks Hofer Gilson & Lione

(57) ABSTRACT

An input device for a personal computer or the like has an elastic member, a slider horizontally movable on the elastic member, and a key top operatively connected to the elastic member through the slider. The elastic member 5 has a coupling portion provided with a flange which vertically movably fits in a fit hole formed in the slider. A horizontal movement of the key top causes the wall of the fit hole of the slider to press the flange, which in turn causes deformation of the flange and of the movable electrode, with the result that the size of the gap and, hence, capacitive value between the movable electrode and the fixed electrode are changed, whereby the direction of movement of the key top is detected with a high degree of accuracy.

8 Claims, 7 Drawing Sheets

INPUT DEVICE

BACKGROUND OF THE INVENTION

1. Field of the Invention

The present invention relates to an input device which makes use of a change in electrostatic capacitance and which is suitable for use in, for example, a personal computer or a remote controller.

2. Description of the Related Art

Various types of input devices relying upon changes in electrostatic capacitance have been proposed in a variety of industrial fields including automotive industries, electric machinery industries, machine industries, civil engineering industries, and so forth. This kind of input devices permits input operations through appropriate changes of electrostatic capacitance, regardless of any change in the ambient temperature.

In operation of such a proposed input device, an operator's finger touches a key top to slide it in a horizontal direction, so that an elastic member connected to the key top is deformed to change the size of a gap formed between a movable electrode formed on the elastic member and a fixed electrode opposing the movable electrode.

This change in the gap size causes a change in the electrostatic capacitance formed between the movable electrode and the fixed electrode, which in turn causes, for example, a movement of a cursor on a personal computer display.

There is an increasing demand for a downsizing of this kind of input device, particularly when the device is contemplated to be used for small-sized devices such as a personal computer or a remote controller.

Downsizing of the input device naturally limits the horizontal stroke of the key top. The user is therefore obliged to delicately operate the input device so as to implement, for example, a desired movement of a cursor on a personal computer display with a very small displacement of the key top. Thus, the operability is impaired and a long time is required to move the cursor exactly to desired position.

Downsizing of the input device naturally reduces the areas of the movable electrode and the fixed electrode, leading to a correspondingly smaller amount of change in the electrostatic capacitance caused by the key top operation. This makes it difficult to sense the change in the electrostatic capacitance, resulting in an inferior sensing precision.

SUMMARY OF THE INVENTION

Accordingly, it is an object of the present invention to provide an input device which, despite a reduced size, provides a horizontal stroke for a key top large enough to ensure superior operability, thereby overcoming the above-described problem.

It is also an object of the present invention to provide an input device which has a reduced size but is yet capable of providing an ample amount of change in the electrostatic capacitance, thus offering a high degree of accuracy of inputting operation, thereby overcoming the above-described problem of the known art.

To these ends, in accordance with one aspect of the present invention, there is provided an input device, comprising: a fixed electrode having a plurality of fixed electrode segments that are sensitive to a vertical inputting operation and a horizontal input operation; an elastic member which is provided, at least at a portion thereof facing the fixed electrode across a predetermined gap, with a conductive movable electrode, the elastic member being deformable so as to vary the size of the gap in response to an input operation; and an input operating section on which the input operation is to be performed, the input operating section being connectable to a coupling portion of the elastic member, whereby, when the input operating section is moved in a horizontal direction, the size of the gap formed between the electrode segments sensitive to the horizontal input operation is varied.

This arrangement permits a horizontal movement of the input operating section to be detected with a high degree of accuracy, thus offering a high inputting precision of the input device.

Preferably, the coupling portion of the elastic member has an elastically deformable flange extending outward from the outer peripheral end thereof, and the input operating section is coupled with the coupling portion having the flange. The flange is elastically deformed in response to a horizontal movement of the input operating section, thus affording a large stroke of horizontal movement of the input operating section. This offers a pleasant feel of manipulation of the input operating section when the same is moved in a horizontal direction.

The input device may further comprise a horizontally movable slider provided on the elastic member. In such a case, the input operating section is operatively connected to the elastic member through the slider, with the flange of the coupling portion being in fitting engagement with a fit hole formed in the slider so as to be vertically movable. A horizontal movement of the input operating section causes the inner peripheral wall of the fit hole to press the flange of the elastic member, whereby the flange and the movable electrode on the elastic member are elastically deformed to cause the variation in the size of the gap. With this arrangement, the movement of the input operating section is transmitted to the elastic member through the slider with a high degree of accuracy. It is therefore possible to achieve a further improvement in the inputting precision of the input device.

The input operating section may be arranged so as to be rotatable about the axis of the coupling portion of the elastic member. When a user attempts to move the input operating section in a horizontal direction with his finger placed on the outer periphery of the input operating section, a rotational force is applied to the input operating section. The rotational nature of the input operating section conveniently accommodates this rotational force to offer a pleasant feel of operation.

The input operating section may be provided with a vertical input portion formed at a portion thereof facing the fixed electrode segment sensitive to vertical input operation, whereby pressing of the portion of the input operating section causes a variation in the gap between the movable electrode and the segment of the fixed electrode sensitive to the vertical input operation.

This arrangement permits a vertical movement of the input operating section to be detected with a high degree of accuracy, thus offering a high inputting precision of the input device.

In accordance with another aspect of the present invention, there is provided an input device comprising: a fixed electrode having a plurality of electrode segments which are spaced in the circumferential direction and which are sensitive to input operations in horizontal directions; an elastic member which is provided, at least at a portion thereof facing the fixed electrode across a predetermined gap, with a conductive movable electrode which is elastically deformable in response to an input operation so as to vary the size of the gap; an input operating section engageable with a coupling portion formed to project from the elastic member; and an insulating film formed on the fixed electrode; wherein the portion of the movable electrode facing the fixed electrode is tapered such that the size of the gap progressively varies from an outer peripheral region of the fixed electrode towards the center of the fixed electrode.

This arrangement permits a large variation of the electrostatic capacitance created between the movable electrode and the fixed electrode per unit amount of movement of the input operating section. The large variation of the electrostatic capacitance can be detected without fail, thus offering a high degree of inputting precision of the input device.

Preferably, the tapered movable electrode has a portion which is held in contact with or in the close proximity of the outer peripheral region of the fixed electrode, and is configured such that the size of the gap progressively increases from the outer peripheral region towards the center of the fixed electrode. When the input operating section is manipulated by a user, the portion of the movable electrode facing the outer peripheral region of the fixed electrode which has a greater area than inner peripheral region is pressed onto the outer peripheral region of the fixed electrode across an insulating film, whereby the amount of variation of the electrostatic capacitance is further increased.

Preferably, the insulating film has a thickness not greater than 20 $\mu$m. This feature provides a large electrostatic capacitance created between the movable electrode and the fixed electrode, as well as a large amount of variation of the electrostatic capacitance, thus offering a high degree of inputting precision of the input device.

The above and other objects, features and advantages of the present invention will become clear from the following description of the preferred embodiments when the same is read in conjunction with the accompanying drawings.

DESCRIPTION OF THE PREFERRED EMBODIMENTS

Figure 5:
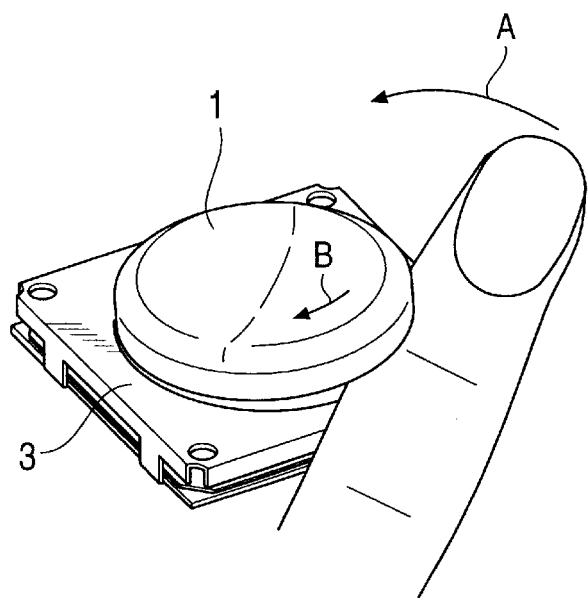
FIG. 5 is a perspective view of the input device shown in FIG. 1, illustrative of a manner in which the input device is operated.
Figure 6:
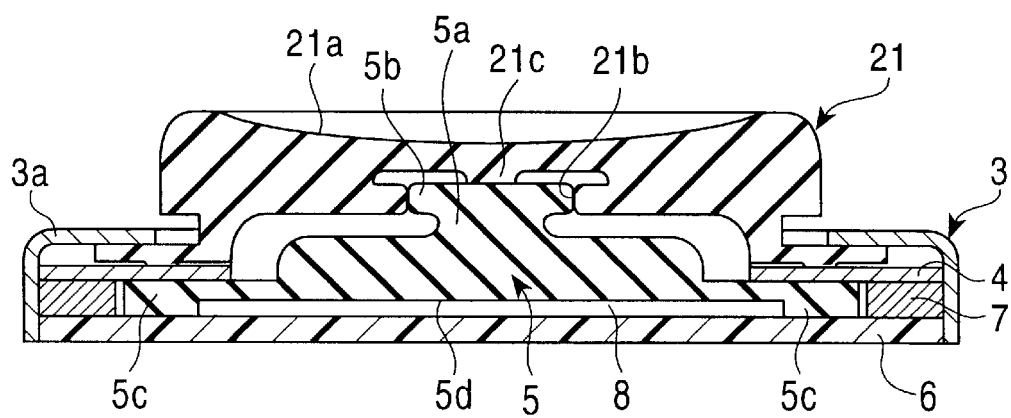
FIG. 6 is a sectional view of an input device in accordance with a second embodiment of the present invention.

A first embodiment of the input device of the present invention will be described first with reference to FIGS. 1 to 5, followed by a description of a second embodiment taken in conjunction with FIG. 6.

Figure 1:
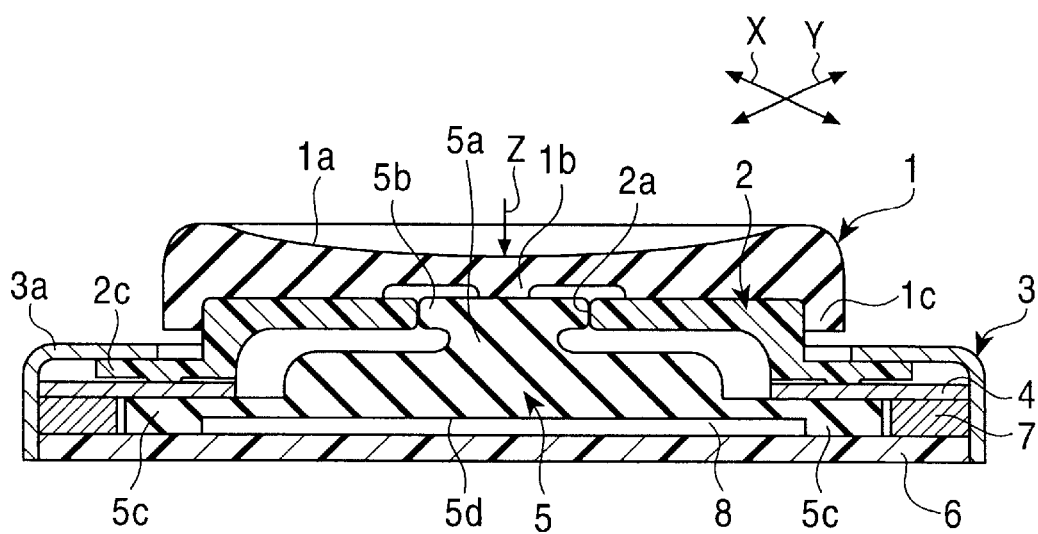
FIG. 1 is a sectional view of an input device according to an embodiment of the present invention.
Figure 2:
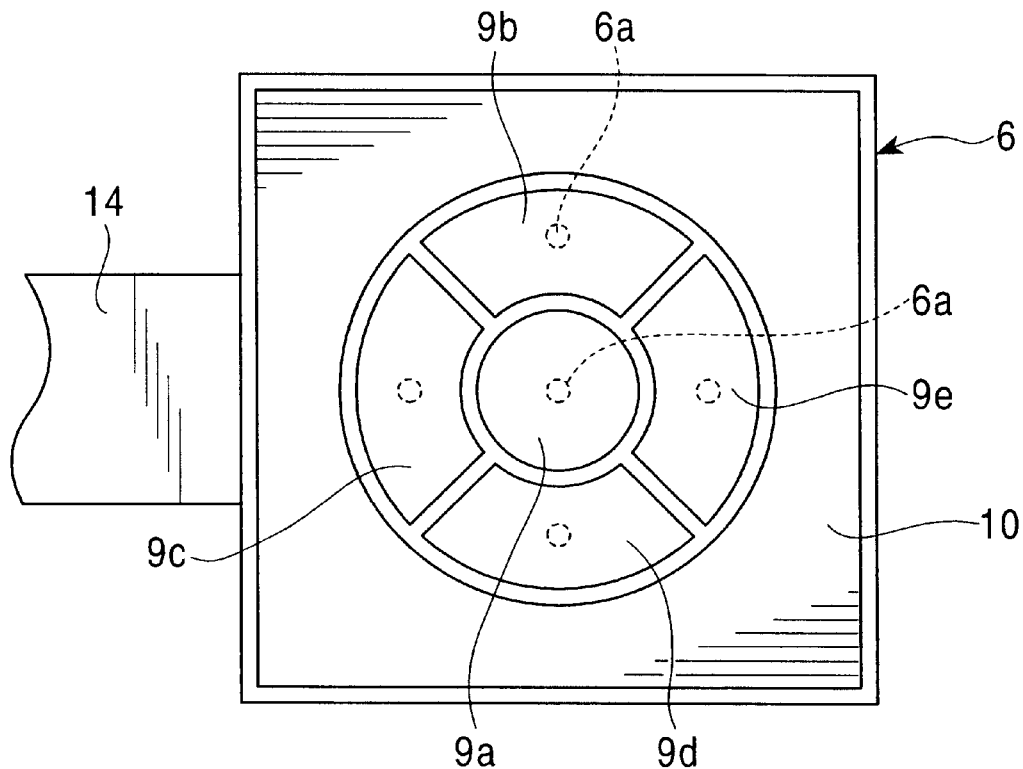
FIG. 2 is a plan view of a printed circuit board incorporated in the input device embodying the present invention.

Referring to FIG. 1, a disk-shaped key top 1 serving as an input operating section, made of an elastic material such as a rubber or an elastomer, has an upper surface which is recessed to provide a manipulating portion 1a. The key-top 1 is tin-walled at a central portion thereof, so that the thin-walled central portion when pressed is elastically deflectable downward.

The key top 1 has a vertical input portion 1b which projects downward from the lower surface of the thin-walled central portion. The key top 1 is also provided with a downwardly projecting peripheral wall 1c which press-fits or snap-fits on a slider 2, whereby the key top 1 is secured to the slider 2.

The slider 2 is made of, for example, a hard resin and is provided with a central fit hole 2b defined by an inner peripheral wall 2a which fits on a flange 5b of a coupling portion 5a of an elastic member 5 which will be described later. The slider 2 has a saucer-like outer peripheral flange portion 2c.

The flange portion 2c of the slider is sandwiched between an upper bend 3a of a metallic housing 3 and a bracket 4, so as to be horizontally movable and rotatable.

The elastic member 5 is made of, for example, a conductive rubber which is electrically conductive over the entire part thereof. The elastic member 5 has a saucer-like form and is provided with the above-mentioned coupling portion which protrudes upward from the center. The coupling portion 5a has a top end portion which spreads radially outward to provide the aforementioned flange 5b which fits in the fit hole 2b of the slider 2. The arrangement is such that, when the key top 1 is moved horizontally, the flange 5b is pressed by the inner peripheral wall 2a of the slider 2, so as to be elastically compressed and deformed.

The top face of the coupling portion 5a of the flange 5b is exposed through the fit hole 2b and is covered by the key top 1.

The key top 1 is mounted on the slider 2 such that the vertical input portion 1b of the key top 1 is held in contact with or in close proximity of the coupling portion 5a.

The slider 2 is disposed to cover the elastic member 5 for movement in horizontal directions and is rotatable about the axis of the coupling portion 5a of the elastic member 5. Therefore, the key top 1 secured to the slider 2 is also rotatable about the axis of the coupling portion 5a of the elastic member 5.

The elastic member 5 has a disk-like outer peripheral portion 5c which is sandwiched between the aforementioned bracket 4 and a printed circuit board 6 which is provided at the bottom of the structure shown in FIG. 1. The outer peripheral portion 5c is surrounded by a supporting member 7 which serves to limit the horizontal movement of the elastic member 5.

A predetermined gap 8 is formed between the printed circuit board 6 and the portion of the elastic member 5 facing the printed circuit board 6. A flattened movable electrode 5d is formed on this portion of the elastic member defining the gap 8. The movable electrode 5d cooperates with a later-mentioned fixed electrode 9 on the printed circuit board 6 in forming therebetween a predetermined electrostatic capacitance.

The arrangement is such that, when the key top 1 is moved horizontally to the left or right for example, the inner peripheral wall 2a of the fit hole 2b of the slider 2 horizontally presses the flange 5b. As a result, the flange 5b and, hence, the movable electrode 5d on the elastic member 5 are deformed to cause a difference between the size of the gap 8 on the left-hand side and the size of the same gap on the right-hand side as viewed in FIG. 1, with the result that the electrostatic capacitance between the movable electrode 5d and the fixed electrode 9 is varied.

The printed circuit board 6 under the elastic member 5 is made of a hard material such as a glass epoxy resin. As will be best seen from FIG. 2, the aforementioned fixed electrode 9 is formed on the surface of the printed circuit board 6 facing the movable electrode 5d on the elastic member 5. The fixed electrode 9 has a central circular first fixed electrode segment 9a and four equally sector-shaped second to fifth fixed electrode segments 9b to 9e arranged at a constant circumferential pitch. All these fixed electrode segments are electrically isolated from each other.

A grounding electrode 10 surrounding the fixed electrode 9 is electrically isolated from the fixed electrode 9.

Figure 3:
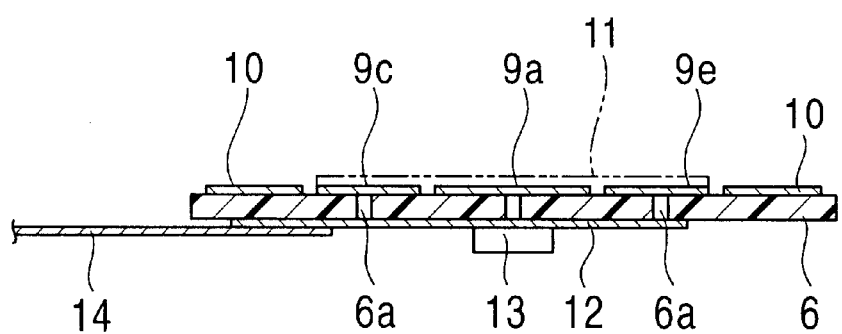
FIG. 3 is a sectional view of the printed circuit board shown in FIG. 2.
Figure 4:
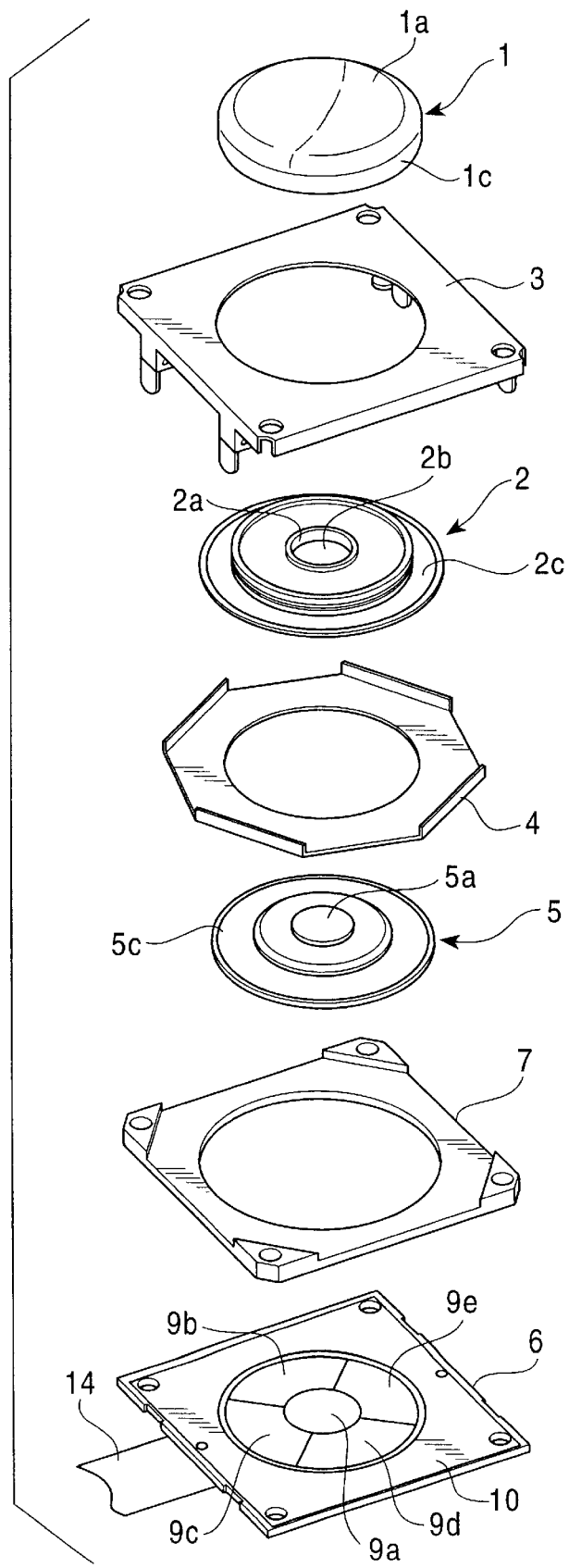
FIG. 4 is an exploded perspective view of the input device shown in FIG. 1.

As will be seen from FIG. 3, the fixed electrode 9 is overlain by a flexible insulating film 11 which prevents shot-circuiting of an electrical circuit due to direct contact between the movable electrode 5d and the fixed electrode 9 which otherwise may occur when the movable electrode is moved towards the fixed electrode due to deformation of the elastic member 5 under a force exerted on the key top 1.

The outer peripheral portion 5c of the conductive elastic member 5 rests on the grounding electrode 10, whereby the elastic member 5 is electrically connected to the grounding electrode 10.

Consequently, an electrostatic capacitance of a predetermined capacitive value is formed between the movable electrode 5d and the fixed electrode 9 across the gap 8. The capacitance value is variable by horizontal movement of the key top 1 or by vertical movement of the vertical input portion 1b.

A description will now be given of the functions of the segments 9a to 9e of the fixed electrode 9, by way of example. The second fixed electrode segment 9b is used for inputting a command for moving a cursor stepwise upward on the display screen of, for example, a personal computer. Likewise, the third, fourth and fifth fixed electrode segments 9c, 9d and 9e are used for effecting leftward, rightward and downward movements of the cursor, respectively, on the display screen. Thus the second to fifth fixed electrode segments 9b to 9e are used for inputting commands for moving the cursor horizontally, i.e., in X- and Y-directions.

The first fixed electrode segment 9a is used for enabling a selection or entry of the input at a desired position on the display screen pointed by the cursor. Thus, the first fixed electrode segment 9a is used for inputting command in a vertical direction, i.e., Z-direction.

Referring further to FIG. 3, a predetermined conductive pattern 12 is formed on the lower side of the printed circuit board 6. The conductive pattern 12 is electrically connected to the segments 9a to 9e of the fixed electrode 9 and to the grounding electrode 10, through via holes 6a.

The conductive pattern 12 also mounts. electronic components 13 such as IC chips. An FPC (Flexible Printed Circuit Board) 14 is connected at its one end to one end of the conductive pattern 12. The other end of the FPC 14 is connected to an input/output interface (not shown) for connection to the apparatus for which the input device is used.

A description will now be given of the operation of the first embodiment of the input device in accordance with the present invention. In an initial or stand-by state in which the key top 1 is freed from a force which might be exerted by, for example, a user's finger, the gap 8 is evenly developed over the entire area where the movable electrode 5d on the elastic member 5 and the fixed electrode 9 on the printed circuit board 6 face each other.

Consequently, the values of the electric capacitance between the second to fifth fixed electrode segments and the movable electrode 5d on the elastic member 5 are equal.

When the key top 1 is moved to the left for example as viewed in FIG. 1, this motion is transmitted from the inner peripheral wall 2a of the fit hole 2b of the slider 2 to the flange 5b of the elastic member 5.

As a result, the right portion of the flange 5b of the elastic member 5 is compressively deformed by the force applied by the inner peripheral wall 2a of the slider 5, while the left portion of the movable electrode 5d as viewed in the Figure is deformed downward, with the result that the size of the gap 8 is reduced in the region where the third fixed electrode segment 9c of the fixed electrode 9 faces the movable electrode 5d. Consequently, the electrostatic capacitance is changed in the region between this fixed electrode segment 9c and the movable electrode 5d.

This change in the electrostatic capacitance on the third fixed electrode segment 9c is electrically sensed. It is thus possible to detect that a command signal for moving the cursor to the left has been input through the key top 1.

When the key top 1 is moved to the right for example as viewed in FIG. 1, this motion is transmitted to the elastic member 5 through the slider 2.

A left portion of the flange 5b of the elastic member 5 as viewed in the Figure, pressed by the inner peripheral wall 2a of the slider 2, is compressively deformed, while the right portion of the movable electrode 5d is deflected downward, with the result that the size of the gap 8 is reduced locally in the region between the fifth fixed electrode segment 9e of the fixed electrode and the movable electrode 5d. Consequently, the electrostatic capacitance between the fifth segment 9e of the fixed electrode 9 and the movable electrode 5d is changed.

This change in the electrostatic capacitance on the fifth fixed electrode segment 9e is sensed electrically. It is thus possible to detect that a command signal for moving the cursor to the right has been input through the key top 1.

Referring again to FIG. 1, when the central portion of the key top 1 where the vertical input portion 1b is formed is pressed downward in the Z-direction by a finger, the thin-walled central portion of the key top 1 is elastically deformed to move the vertical input portion 1b downward, while the slider 2 remains unmoved.

As a result, the coupling portion 5a of the elastic member 5 is pressed by the vertical input portion 1b, so that the elastic member 5 is deformed to reduce the size of the gap 8 in the region where the movable electrode 5d faces the first segment 9a of the fixed electrode 9. This causes a change in the electrostatic capacitance between the first fixed electrode segment 9a and the movable electrode 5d. This change in the electrostatic capacitance is electrically detected. It is thus possible to detect that the key top 1 has been pressed vertically downward.

When the key top 1 is relieved from the horizontal or vertical force that has been exerted thereon, the key top 1, slider 2 and the elastic member 5 resume their initial positions, by virtue of the elastic restoration force of the member 5 or the key top 1 itself.

In the first embodiment of the input device in accordance with the present invention, the slider 2 is placed on the elastic member 5 for movement in horizontal directions, as well as for rotation about the axis of the coupling portion of the coupling portion 5a of the elastic member 5. Therefore, the key top 1 which is secured to the slider 2 is also rotatable.

The rotatable nature of the key top 1 offers the following advantage. Referring to FIG. 5, when a user attempts to move the key top 1 in the direction of an arrow A, with a finger placed on the peripheral part of the key top 1 as illustrated in FIG. 5, a force may act on the key top 1 so as to rotate the key top 1 in the direction of an arrow B. Such a rotational force is accommodated by a rotation of the key top 1 in the direction of the arrow B, whereby the user can obtain a pleasant feel of operation.

In the first embodiment as described, the elastic member 5 in its entirety is made of an electrically conductive rubber. This, however, is only illustrative and the arrangement may be such that the elastic member 5 is formed from an electrically insulating rubber and an electrically conductive sheet (not shown) is bonded to the elastic member 5, the sheet being connected at a part thereof to the grounding electrode 10 of the printed circuit board 6.

In other words, it suffices that the elastic member 5 has an electrically conductive movable electrode 5d at at least a portion thereof facing the fixed electrode 9 across a predetermined gap.

A second embodiment of the input device in accordance with the present invention will now be described with specific reference to FIG. 6. As will be seen from this Figure, the second embodiment has a key top 21 which is directly coupled to the elastic member 5. The key top 21 has an upper surface presenting an input manipulating portion 21a, and is provided in the center of the bottom thereof with a fit portion 21b which fits on the coupling portion 5b of the elastic member 5. A vertical input portion 21c is projected downward from the lower surface of the key top 21 presenting the fit portion 21b.

The key top 21 has an outer peripheral flange portion 21d which is sandwiched between an upper bend of the housing 3 and the bracket 4, so as to allow the key top 21 to move in horizontal directions, as well as in rotational directions.

Thus, the second embodiment is devoid of the slider 2 which is used in the second embodiment, thus contributing to a reduction in the number of the parts.

Figure 7:
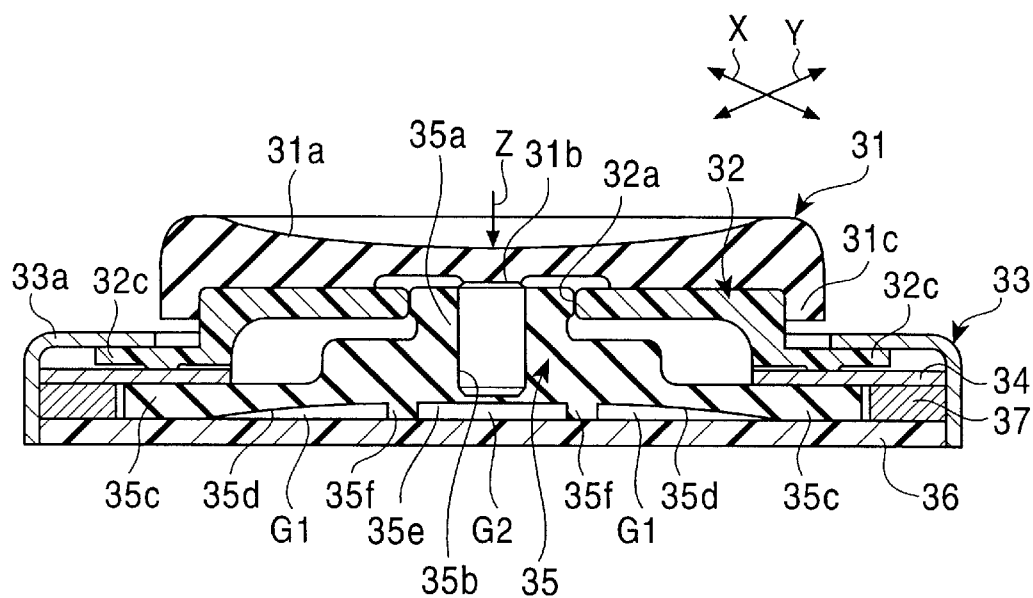
FIG. 7 is a sectional view of an input device in accordance with a third embodiment of the present invention.
Figure 8:
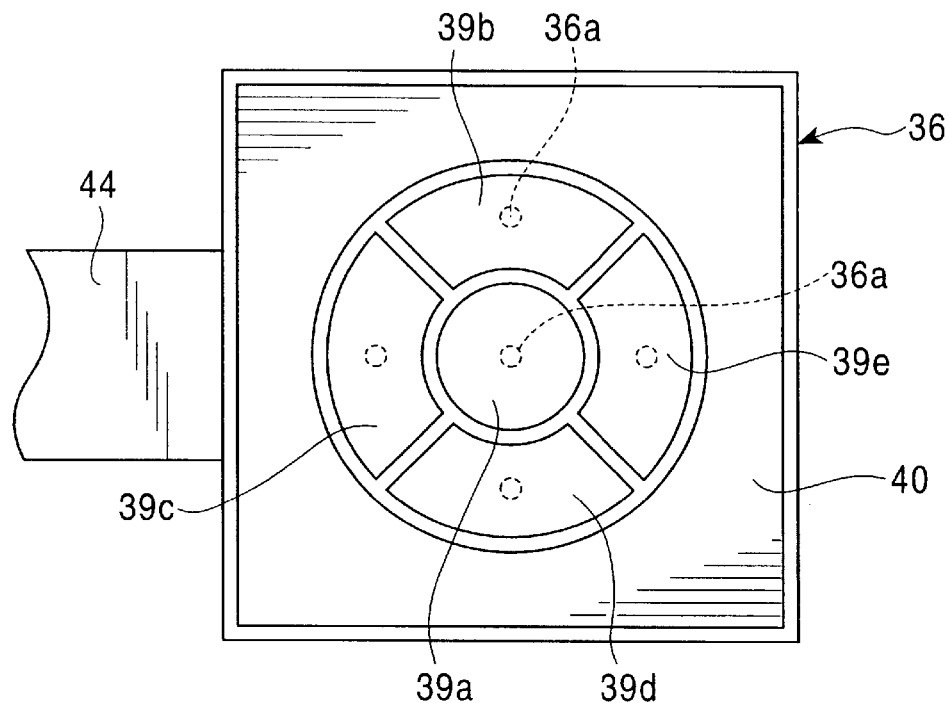
FIG. 8 is a plan view of a printed circuit board incorporated in the input device shown in FIG. 7.
Figure 9:
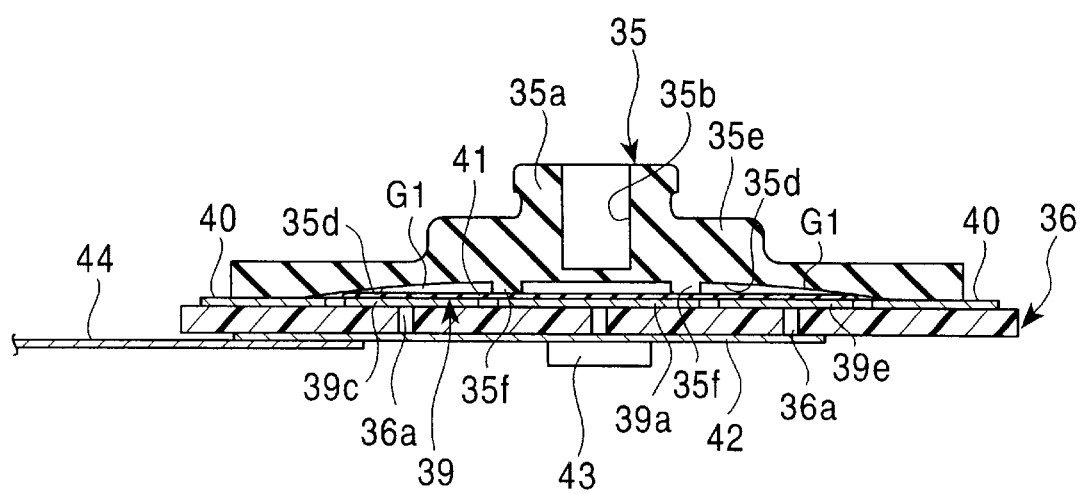
FIG. 9 is a sectional view of an assembly having the printed circuit board of FIG. 8 together with an elastic member.
Figure 10:
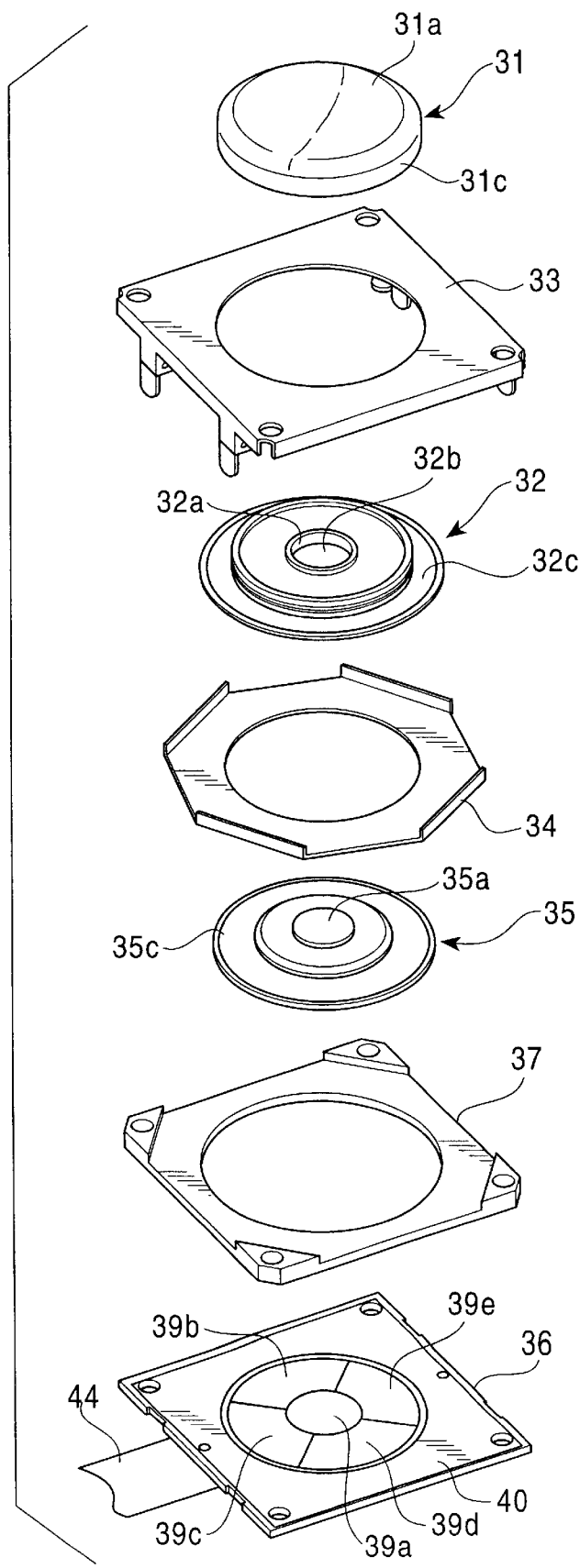
FIG. 10 is an exploded perspective view of the input device shown in FIG. 7.

A third embodiment of the input device in accordance with the present invention will be described with reference to FIGS. 7 to 10. FIG. 7 is a sectional view of the input device of the third embodiment. FIG. 8 is a plan view of a printed circuit board incorporated in the input device. FIG. 9 is a sectional view of an elastic member and the printed circuit board. FIG. 10 is an exploded perspective view of the input device.

The input device in accordance with the third embodiment has, as shown in FIG. 7, a disk-shaped key top 31 made of an elastic member such as a rubber or an elastomer. The upper surface of the key top 31 is recessed to provide an input manipulating portion 31a. The key top 31 is thin-walled at a central region thereof.

The thin-walled central region of the key top 31 is elastically deformable downward by a pressure exerted thereon by, for example, a user's finger.

The key top 31 has a vertical input portion 31b which projects downward from the lower surface of the thin-walled central portion. The key top 1 is also provided with a downwardly projecting peripheral wall 31c which press-fits or snap-fits on a slider 32, whereby the key top 31 is secured to the slider 32.

The slider 32 is made of, for example, a hard resin and is provided with a central fit hole 32b defined by an inner peripheral wall 32a which fits on a coupling portion 35a of an elastic member 35 which fill be described later. The slider 32 has a saucer-like outer peripheral flange portion 32b.

The flange portion 32b of the slider is sandwiched between an upper bend 33a of a metallic housing 33 and a bracket 34, so as to be horizontally movable and rotatable.

The elastic member 35 is made of, for example, a conductive rubber which is electrically conductive over the entire part thereof. The elastic member 35 has a saucer-like form and is provided with the above-mentioned coupling portion 35a which protrudes upward from the center. The coupling portion 35a fits in the fit hole 32b of the slider 32. The arrangement is such that, when the key top 31 is moved horizontally, the coupling portion 35a is pressed by the inner peripheral wall 32a of the slider 32, so that the elastic member 35 is elastically compressed and deformed.

The top face of the coupling portion 5a of the coupling portion 35a is exposed through the fit hole 32a and is covered by the key top 31.

The slider 32 is disposed to cover the elastic member 35 for movement in horizontal directions and is rotatable about the axis of the coupling portion 35a of the elastic member 35. Therefore, the key top 31 is also rotatable about the axis of the coupling portion 35a of the elastic member 35.

An operation hole 35b of a predetermined depth is formed in the center of the coupling portion 35a of the elastic member 35. An operating pin 38 made of a resin fits in the operation hole 35b. The operating pin 38 has a top surface which is adapted to be contacted by the vertical input portion 31b of the key top 31. The arrangement is such that the operating pin 38 is moved downward by the vertical input portion 31b when the key top 31 is pressed downward.

The elastic member 35 has a disk-like outer peripheral portion 35c which is sandwiched between the aforementioned bracket 34 and a printed circuit board 36 which is provided at the bottom of the structure shown in FIG. 7. The outer peripheral portion 35c is surrounded by a supporting member 37 which serves to limit the horizontal movement of the elastic member 35.

A tapered first movable electrode 35d is formed on the lower side of the elastic member 35 in the region where it faces a fixed electrode 39 which will be described later. The arrangement is such that the size of a gap formed between the first movable electrode 35d and the fixed electrode 39 varies along the radii of the fixed electrode 39.

More specifically, the tapered first movable electrode 35d has an outer peripheral portion 35c which opposes an outer peripheral region of the fixed electrode 39 and which is held in contact with or in close proximity of the fixed electrode 39, such that the size of a first gap G1 progressively increases along the radius of the fixed electrode 39 starting from the outer peripheral ends towards the center.

The size of the first gap G1 is about 200 $\mu$m at the region where this gap size is maximized.

A flat second movable electrode 35e, having a depth of about 200 $\mu$m, is formed in the central region of the lower face of the elastic member 35. The second movable electrode 35e defines a second gap G2. The elastic member 35 further has a ridge 35f which surrounds the second movable electrode 35e, so that the size of the second gap G2 remains unchanged despite any downward force applied to the elastic member 35.

The printed circuit board 36 disposed under the elastic member 35 is made of a hard material such as a glass epoxy resin. The aforesaid fixed electrode 39 is formed on the surface of the printed circuit board 36 which faces the first and second movable electrodes 35*d* and 35*e*, as will be seen from FIG. 8.

The fixed electrode 39 has a central circular first electrode segment 39*a* and four sector-shaped segments: namely, a second electrode segment 39*b*, a third electrode segment 39*c*, a fourth electrode segment 39*d* and a fifth. electrode segment 39*e*, which are equally spaced in the circumferential direction. These first to fifth segments 39*a* to 39*e* are electrically isolated from one another.

A grounding electrode 40 surrounding the fixed electrode 39 is electrically insulated from the fixed electrode 39. The outer peripheral portion 35*c* of the conductive elastic member 35 rests on the grounding electrode 40 so as to be in electrical connection therewith.

The fixed electrode 39 composed of the segments 39*a* to 39*e* are covered by an insulating film 41 as shown in FIG. 9. The insulating film 41 serves to electrically insulate the fixed electrode 39 from the first and second movable electrodes 35*d* and 35*e*, as well as from the ridge 35*f*, which are arranged above the fixed electrode 39.

The insulating film 41 has a material having a large dielectric constant, e.g., 2 or greater, and is formed by printing so as to have a thickness not greater than 20 $\mu$m.

It is therefore possible to obtain an initial electrostatic capacitance as large as about 6 pF (picofarad) between each of the fixed electrode segments 39*a* to 39*e* and the first and second movable electrodes 35*d*, 35*e*, even though the areas of the electrode segments 39*a* to 39*e* are small.

For the same reason, it is possible to obtain a large variance of the electrostatic capacitance on the order of 1 to 2 pF, when the sizes of the first and second gaps G1 and G2 are reduced by the deformation of the first and second movable electrodes 35*d*, 35*e* caused by a force exerted on the key top 31.

Thus, the input device of the third embodiment offers a large amount of variation of the electrostatic capacitance and, hence, a higher accuracy of detection of such a variation.

A description will now be given of the functions of the segments 39*a* to 39*e* of the fixed electrode 39, by way of example. The second fixed electrode segment 39*b* is used for inputting a command for moving a cursor stepwise upward on the display screen of, for example, a personal computer. Likewise, the third, fourth and fifth fixed electrode segments 39*c*, 39*d* and 93*e* are used for effecting leftward, rightward and downward movements of the cursor, respectively, on the display screen. Thus the second to fifth fixed electrode segments 39*b* to 39*e* are used for inputting commands for moving the cursor horizontally, i.e., in X- and Y-directions.

The first fixed electrode segment 39*a* is used for enabling a selection or entry of the input at a desired position on the display screen pointed by the cursor. Thus, the first fixed electrode segment 39*a* is used for inputting command in a vertical direction, i.e., Z-direction.

Referring further to FIG. 9, a predetermined conductive pattern 42 is formed on the lower side of the printed circuit board 36. The conductive pattern 42 is electrically connected to the segments 39*a* to 39*e* of the fixed electrode 39 and to the grounding electrode 40, through via holes 36*a*.

The conductive pattern 42 also mounts a sensor element 43 such as an IC chip capable of sensing the variation of the electrostatic capacitance. An FPC (Flexible Printed Circuit Board) 44 is connected at its one end to one end of the conductive pattern 42. The other end of the FPC 44 is connected to an input/output interface (not shown) for connection to the apparatus for which the input device is used.

A description will now be given of the operation of the third embodiment of the input device in accordance with the present invention. In an initial or stand-by state in which the key top 31 is freed from a force which might be exerted by, for example, a user's finger, the tapered first gap G1 is equally developed for the second to fifth segments 39*b* to 39*e* with respect to the first movable electrode 35*d*.

Consequently, the values of the electric capacitance between the second to fifth fixed electrode segments 39*b* to 39*e* and the movable electrode 35*d* on the elastic member 35 are equal.

When the key top 31 is moved to the left for example as viewed in FIG. 7, this motion is transmitted from the slider 32 to the coupling portion 35*a* of the elastic member 35.

As a result, the coupling portion 35*a* of the elastic member 35 is tilted to the left as viewed in the Figure, while the left portion of the first electrode 35*d* as viewed in the Figure is deflected downward, whereby the outer peripheral portion of the tapered first movable electrode 35*d* is pressed against the third electrode segment 39*c* of the fixed electrode 39 across the insulating film 41, whereby the electrostatic capacitance on the third electrode segment 39*c* is largely varied.

This change in the electrostatic capacitance on the third fixed electrode segment 39*c* is electrically sensed. It is thus possible to detect that a command signal for moving the cursor to the left has been input through the key top 1.

When the key top 31 is moved to the right for example as viewed in FIG. 7, this motion is transmitted to the elastic member 35 through the slider 32.

As a result, the coupling portion 35*a* of the elastic member 35 is tilted rightward, so that the right portion of the first movable electrode 35*d* as viewed in the Figure is deformed downward. Consequently, the right portion of the first movable electrode 35*d* adjacent the outer peripheral portion 35*c* is brought into tight contact with the fifth segment 39*e* of the fixed electrode 39 across the insulating film 41, whereby the electrostatic capacitance on the fifth segment 39*e* of the fixed electrode 39 is varied.

This change in the electrostatic capacitance on the fifth fixed electrode segment 39*e* is sensed electrically by means of the aforesaid sensor element 43. It is thus possible to detect that a command signal for moving the cursor to the right has been input through the key top 31.

Referring again to FIG. 7, when the central portion of the key top 31 where the vertical input portion 31*b* is formed is pressed downward in the Z-direction by a finger, the thin-walled central portion of the key top 31 is elastically deformed to move the vertical input portion 31*b* downward, while the slider 2 remains unmoved.

As a result, the operating pin 38 is pressed downward by the vertical input portion 31*b*, so that the second movable electrode 35*e* is deformed downward. The downward deflection of the second movable electrode 35*e* causes the size of the gap G2 between the first electrode segment 39*a* of the fixed electrode 9 and the second movable electrode 35*e* to be reduced from the initial size, whereby the electrostatic capacitance on the first electrode segment 39*a* is varied.

This change in the electrostatic capacitance on the first electrode segment 39a is electrically detected by the sensor element 43. It is thus possible to detect that the key top 31 has been pressed vertically downward.

When the key top 31 is relieved from the horizontal or vertical force that has been exerted thereon, the key top 13, slider 32 and the elastic member 35 resume their initial positions, by virtue of the elastic restoration force of the elastic member 35 or the key top 31 itself.

In the third embodiment as described, the tapered first movable electrode 35d is so configured that the size of the first gap G1 progressively increases from the peripheral region of the fixed electrode 9 towards the center of the same. This arrangement, however, is not exclusive and the tapered first movable electrode 35d may be so configured that a portion thereof facing the central portion of the fixed electrode 39 is held in contact with or in the close proximity of the fixed electrode 39, with the size of the gap G1 progressively increasing from the central region towards the outer peripheral end.

More specifically, it suffices only that the portion of the first movable electrode 35d facing the fixed electrode 39 is so tapered as to progressively change the size of the first gap G1 such that the size of the first gap G1 at the outer peripheral region of the fixed electrode 39 is different from the size at the central region of the fixed electrode 39.

In the third embodiment as described, the elastic member 35 in its entirety is made of an electrically conductive rubber. This, however, is only illustrative and the arrangement may be such that the elastic member 35 is formed from an electrically insulating rubber, and a separate member made of an electrically conductive rubber is attached to the side of the elastic member 5 that provides the first and second movable electrodes 35d, 35e, the conductive rubber member being connected at a part thereof to the grounding electrode 40 of the printed circuit board 36.

In other words, it suffices that the elastic member 35 has electrically conductive movable electrodes 5d at at least a portion thereof facing the fixed electrode 39 across a predetermined gap.

Although the invention has been described through its specific form, it is to be understood that the described embodiments are only illustrative and various changes and modifications may be imparted thereto without departing from the scope of the invention which is limited solely by the appended claims.

What is claimed is:

1. An input device, comprising:
    a fixed electrode having a plurality of fixed electrode segments that are sensitive to a vertical inputting operation and a horizontal input operation;
    an elastic member which is provided, at least at a portion thereof facing said fixed electrode across a predetermined gap, with a conductive movable electrode, said elastic member being deformable so as to vary the size of said gap in response to an input operation; and
    an input operating section on which the input operation is to be performed, said input operating section being connectable to a coupling portion of said elastic member,
    whereby, when said input operating section is moved in a horizontal direction, the size of said gap formed between said electrode segments sensitive to the horizontal input operation is varied.

2. An input device according to claim 1, wherein said coupling portion of said elastic member has an elastically deformable flange extending outward from the outer peripheral end thereof, and said input operating section is coupled with said coupling portion having said flange.

3. An input device according to claim 2, further comprising a horizontally movable slider provided on said elastic member, said input operating section being operatively connected to said elastic member through said slider, said flange of said coupling portion being in fitting engagement with a fit hole formed in said slider so as to be vertically movable, whereby a horizontal movement of said input operating section causes the inner peripheral wall of said fit hole to press said flange of said elastic member, whereby said flange and said movable electrode on said elastic member are elastically deformed to cause the variation in the size of said gap.

4. An input device according to claim 3, wherein said input operating section is arranged so as to be rotatable about the axis of said coupling portion of said elastic member.

5. An input device according to claim 1, wherein said input operating section is provided with a vertical input portion formed at a portion thereof facing the fixed electrode segment sensitive to vertical input operation, whereby pressing of said portion of said input operating section causes a variation in the gap between said movable electrode and said segment of said fixed electrode sensitive to the vertical input operation.

6. An input device comprising:
    a fixed electrode having a plurality of electrode segments which are sensitive to input operations in horizontal directions and which are spaced in the circumferential direction;
    an elastic member which is provided, at least at a portion thereof facing said fixed electrode across a predetermined gap, with a conductive movable electrode which is elastically deformable in response to an input operation so as to vary the size of said gap;
    an input operating section which can be coupled with a coupling portion formed to project from said elastic member; and
    an insulating film formed on said fixed electrode;
    wherein the portion of said movable electrode facing said fixed electrode is tapered such that the size of said gap progressively varies from an outer peripheral region of said fixed electrode towards the center of said fixed electrode.

7. An input device according to claim 6, wherein the tapered movable electrode has a portion which is held in contact with or in the close proximity of said outer peripheral region of said fixed electrode, and is configured such that the size of said gap progressively increases from said outer peripheral region towards the center of said fixed electrode.

8. An input device according to claim 6, wherein said insulating film has a thickness not greater than 20 $\mu$m.

* * * * *